US006713335B2

(12) United States Patent
Yen et al.

(10) Patent No.: US 6,713,335 B2
(45) Date of Patent: Mar. 30, 2004

(54) METHOD OF SELF-ALIGNING A DAMASCENE GATE STRUCTURE TO ISOLATION REGIONS

(75) Inventors: Daniel Yen, Singapore (SG); Ching-Thiam Chung, Singapore (SG); Wei Hua Cheng, Singapore (SG); Chester Nieh, Singapore (SG); Tong Boon Lee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 30 days.

(21) Appl. No.: 10/225,805

(22) Filed: Aug. 22, 2002

(65) Prior Publication Data

US 2004/0038466 A1 Feb. 26, 2004

(51) Int. Cl.[7] .......................................... H01L 21/8238
(52) U.S. Cl. ........................ 438/199; 438/183; 438/196; 438/197; 438/221; 438/299
(58) Field of Search .............................. 438/183, 184.1, 438/85, 196, 19, 7, 199, 218, 221, 224, 229, 230, 240, 275, 299, 424, 585, 675

(56) References Cited

U.S. PATENT DOCUMENTS

5,789,792 A  8/1998  Tsutsumi ..................... 257/506
6,248,643 B1  6/2001  Hsieh et al. .................. 438/424
6,258,677 B1  7/2001  Ang et al. .................... 438/300
6,261,887 B1  7/2001  Rodder ......................... 438/218

Primary Examiner—Evan Pert
Assistant Examiner—Asok Kumar Sarkar
(74) Attorney, Agent, or Firm—George O. Saile; Rosemary L. S. Pike (57) ABSTRACT

A process for fabricating a CMOS device in which conductive gate structures are defined self-aligned to shallow trench isolation (STI), regions, without using a photolithographic procedure, has been developed. The process features definition of shallow trench openings in regions of a semiconductor substrate not covered by dummy gate structures, or by silicon oxide spacers located on sides of the dummy gate structures. Filling of the shallow trench openings with silicon oxide, and removal of the dummy gate structures, result in STI regions comprised of filled shallow trench openings, overlying silicon oxide shapes, and silicon oxide sidewall spacers on the sides of the overlying silicon oxide shapes. Formation of silicon nitride spacers on the sides of the STI regions, is followed by deposition of a high k gate insulator layer and of a conductive gate structure, with the conductive gate structure formed self-aligned to the STI regions.

33 Claims, 8 Drawing Sheets

METHOD OF SELF-ALIGNING A DAMASCENE GATE STRUCTURE TO ISOLATION REGIONS

BACKGROUND OF THE INVENTION (1) Field of the Invention

The present invention relates to methods used to fabricate semiconductor devices, and more specifically to a method used to self-align a damascene type gate structure to isolation regions.

(2) Description of Prior Art

Micro-miniaturization, or the ability to fabricate semiconductor devices comprised with sub-micron features, has been directly related to advances in photolithography. The use of more sophisticated exposure cameras as well as the use of more advanced photosensitive materials have allowed the desired sub-micron images to be defined in photoresist layers. The same photoresist layers comprised with the sub-micron images, are than used as an etch mask to allow the sub-micron images or features to be transferred to materials used for semiconductor device via anisotropic dry etching procedures. However the ability to correctly align or overlay overlying sub-micron features to underlying sub-micron features can still present problems.

The present invention will describe a novel process sequence in which a gate structure, and an underlying gate insulator layer, are formed, self-aligned to existing isolation regions. This novel process sequence employs only a single photolithographic procedure, and a single photolithographic mask or retide, to form the isolation regions, the subsequent self-aligned gate insulator layer and the gate structure. The gate structure and underlying gate insulator layer, can be formed via damascene procedures, with the gate insulator layer comprised of a high dielectric constant (high k) gate insulator layer. Prior arts such as: Ang et al, in U.S. Pat. No. 6,258,677 1; Rodder, in U.S. Pat. No. 6,261,887 B1; Hsieh et al, in U.S. Pat. No. 6,248,634; and Tsutsumi, in U.S. Pat. No. 5,789,792, describe methods of integrating gate structures with already formed isolation regions. However none of these prior arts describe the novel process sequence described in this present invention in which a damascene type gate structure and gate insulator layer are defined self-aligned to isolation regions.

SUMMARY OF THE INVENTION

It is an object of this invention to fabricate a semiconductor device in which the gate structure, and underlying gate insulator layer are self-aligned to isolation regions.

It is another object of this invention to define a damascene type, gate structure and gate insulator layer, self-aligned to isolation regions without the use of a photolithographic procedure for definition of the gate structures.

In accordance with the present invention a method of forming a gate structure and underlying gate insulator shape, self-aligned to isolation regions, is described. Silicon nitride shapes are formed on the top surface of both P well and N well regions located in top portions of a semiconductor substrate. After formation of the heavily doped source/drain regions, in portions of the P well and N well regions not covered by the silicon nitride shapes, silicon oxide spacers are formed on the sides of the silicon nitride shapes, overlying portions of the heavily doped source/drain regions. Photolithographic and dry etching procedures are then employed to form shallow trench shapes in portions of the semiconductor substrate located between the silicon nitride shapes, which are lined with the silicon oxide spacers. Filling of the shallow trench shapes with silicon oxide is followed by densification and planarization procedures resulting in shallow trench isolation (STI) structures, with bottom portions of the STI structures located in the P well and N well regions of the semiconductor substrate, while overlying top portions of the STI structures are located between the silicon nitride shapes. Selective removal of the silicon nitride shapes results in STI structures now comprised with, and widened by the addition of the remaining silicon oxide spacers. After formation of silicon nitride spacers on the sides of the STI structures, a high dielectric constant (high k) layer, and a conductive layer are deposited, followed by an etch back procedure resulting in a damascene type conductive gate structure and a high k gate insulator layer located between the silicon nitride spacers, which in turn are located on the sides of the exposed STI structures. Selective removal of the silicon nitride spacers allows the formation of lightly doped source/drain (LDD) regions, to be accomplished in the vacated space, with the LDD regions butting the heavily doped source/drain regions located under the STI regions. Refilling of the spaces created by removal of the silicon nitride spacers, with a silicon nitride—silicon oxide composite layer is followed by deposition of an interlevel dielectric (ILD) layer. Openings to the heavily doped source/drain regions in both P well and N well regions, are then accomplished in the ILD layer and in top portions of the STI structures, via selective dry etching procedures, using the silicon nitride component of the composite layer as a sidewall etch stop layer. Deposition of a metal layer, filling the openings, is followed by patterning procedures defining the desired metal contact and interconnect structures.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
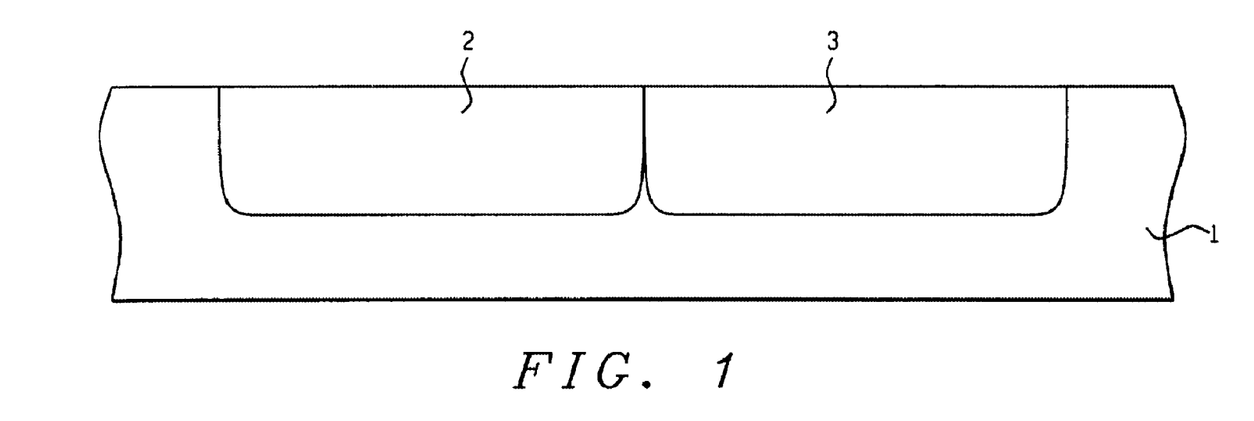
FIGS. 1–15, which schematically, in cross-sectional style, describe key stages used to fabricate a gate structure and underlying gate insulator shape, both self-aligned to isolation regions.

The method of forming a complimentary metal oxide semiconductor (CMOS) device, comprised with an N channel, metal oxide semiconductor (NMOS) device, and a P channel, metal oxide semiconductor (PMOS), and featuring a fabrication procedure allowing self-alignment of a gate structure and an underlying gate insulator layer to isolation regions, will now be described in detail. Semiconductor substrate 1, comprised of a P type, single crystalline silicon substrate, with a <100> crystallographic orientation, is used and schematically shown in FIG. 1. P well region 2, to be used to accommodate the NMOS device, is formed in a first region of semiconductor substrate 1. A photoresist shape (not shown in the drawings), is used as a block out mask, allowing implantation of boron or $BF_2$ ions to be performed in the first region of the semiconductor substrate, resulting in the formation of P well region 2. After removal of the photoresist block out shape (not shown in the drawings), via plasma oxygen ashing procedures, another photoresist block shape is used to mask P well region 2, from an implantation procedure used to form N well region 3, in a second region of semiconductor substrate 1. This is accomplished via implantation of arsenic or phosphorous ions. The photoresist block out shape is again removed via plasma oxygen ashing procedures. During the well formation procedures additional implantation procedures are performed to form punch through and threshold voltage adjust regions in top portions of both well regions. These regions are not shown in the drawings.

Figure 2:
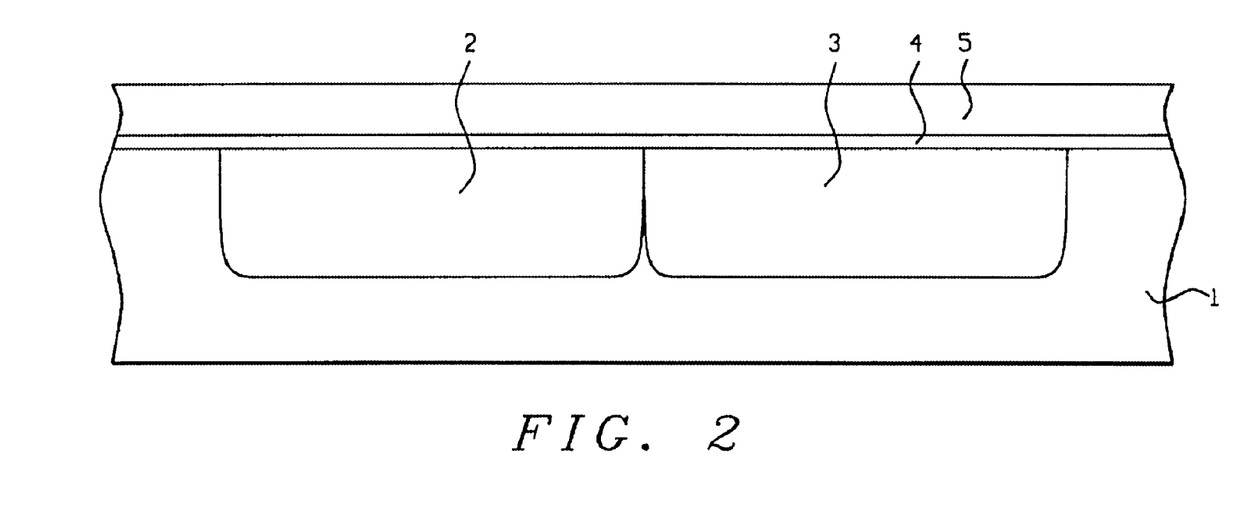
Figure 3:
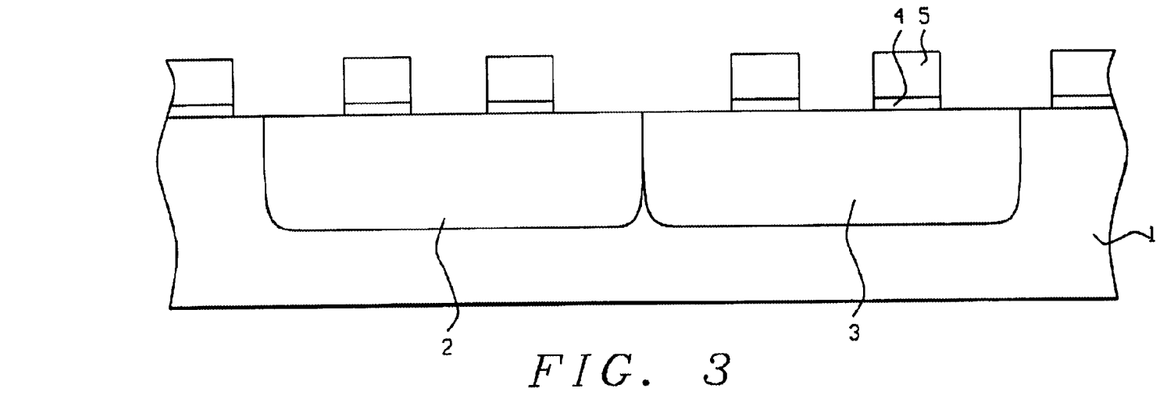

The attainment of dummy gate mask shapes, to be used for definition of the heavily doped source/drain regions for the NMOS device in P well region 2, and for the PMOS device in N well region 3, is next addressed and described using FIGS. 2–3. Silicon dioxide layer 4, to be used as a pad oxide layer, is first formed on the top surface of semiconductor substrate 1, at a thickness between about 30 to 1000 Angstroms, via thermal oxidation procedures, or via low pressure chemical vapor deposition (LPCVD), or plasma enhanced chemical vapor deposition (PECVD), procedures. Overlying silicon nitride layer 5, is then deposited at a thickness between about 50 to 2000 Angstroms, via LPCVD or PECVD procedures. A photoresist shape, (not shown in the drawings), is next use as an etch mask to allow definition of the dummy mask gate shapes comprised of silicon nitride layer 5, on pad silicon oxide layer 4. The definition of the dummy gate mask shapes is accomplished via an anisotropic reactive ion etch (RIE), procedure, using $CF_4$ or $Cl_2$ as an etchant for silicon nitride, while using $CHF_3$ as a selective etchant for silicon oxide layer 4, with the RIE procedure selectively terminating with the appearance of the top surface of semiconductor substrate 1. The photoresist shape used for definition of the dummy gate mask shapes is removed via plasma oxygen ashing.

Figure 4:
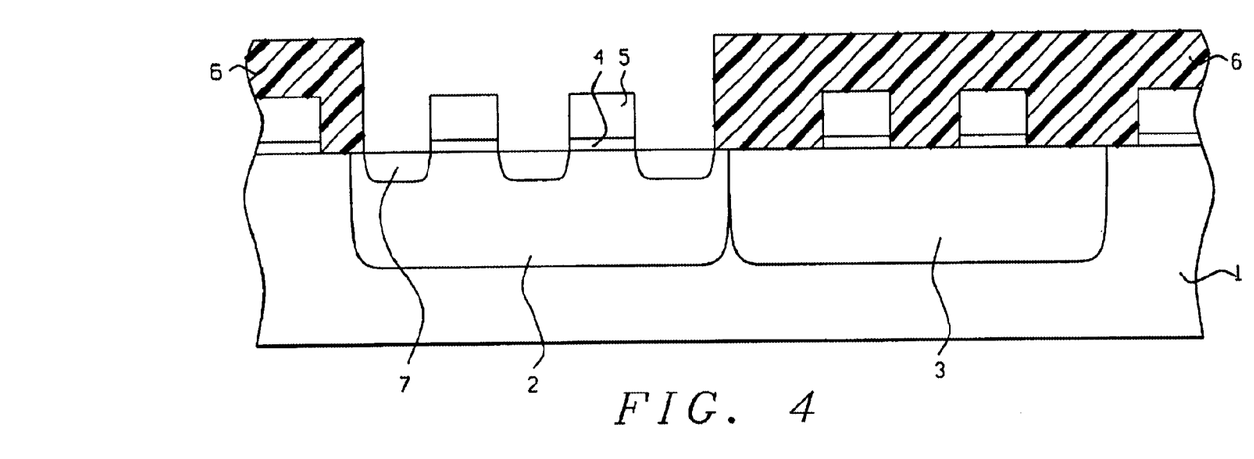
Figure 5:
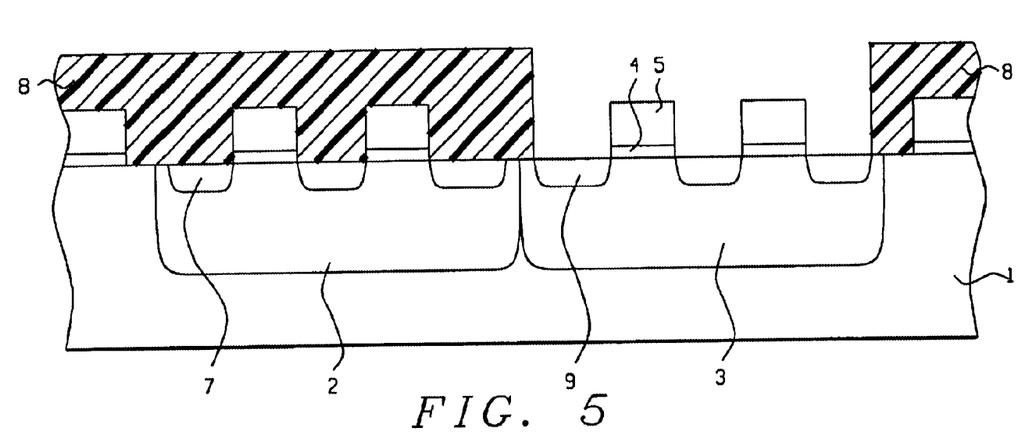

Photoresist shape 6, is next formed and used to protect N well region 3, located in the PMOS region of semiconductor substrate 1, from an implantation procedure used to define heavily doped N type source/drain regions 7, in P well region 2. This is accomplished using arsenic or phosphorous ions, implanted at an energy between about 1 to 100 KeV, at a dose between about 1E15 to 5E15 atoms/$cm^2$. The result of this procedure is schematically shown in FIG. 4. After removal of photoresist shape 6, via plasma oxygen ashing procedures, photoresist shape 8, is formed and used to block out the NMOS region of semiconductor substrate 1, from an implantation procedure used to form heavily doped P type source/drain regions 9, in N well region 3, located in the PMOS region of semiconductor substrate 1. This is accomplished using boron of $BF_2$, implanted at an energy between about 0.1 to 30 KeV, at a dose between about 1E15 to 5E15 atoms/$cm^2$. The result of this procedure is schematically illustrated using FIG. 5. At the completion of the implantation procedure used to define heavily doped P type source/drain regions 9, photoresist shape 8, is removed using plasma oxygen ashing procedures.

Figure 6:
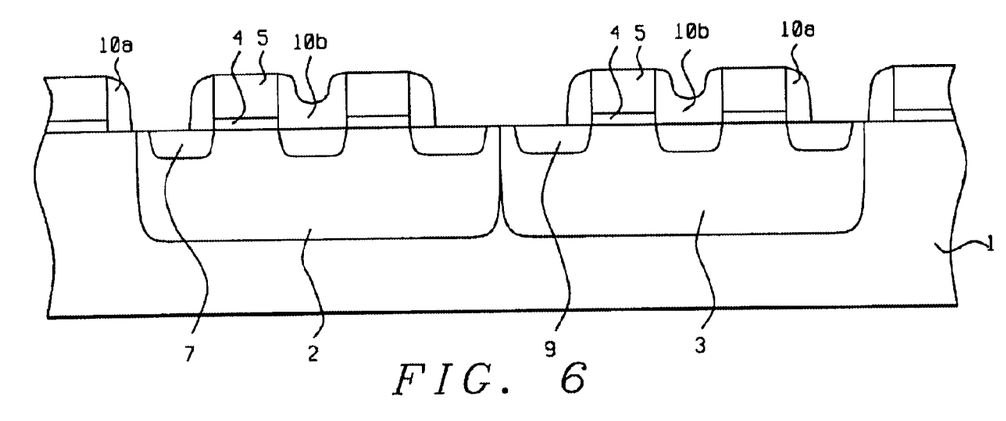

A silicon oxide layer is next deposited to a thickness between about 50 to 1000 Angstroms, via LPCVD or PECVD procedures using tetraethylorthosilicate (TEOS), as a source. Narrow spaces between the dummy gate mask shapes located on both well regions are completely filled by the silicon oxide layer, while the wider spacers located between a dummy gate mask shape on a well region and a dummy gate mask shape located outside a well region, are not filled by the silicon oxide layer. A blanket, anisotropic RIE procedure, using $CHF_3$ as an etchant for silicon oxide, is next employed to form silicon oxide spacers 10a, on the sides of dummy gate mask shapes exposed in the wider spaces, while the narrower spaces between dummy gate mask shapes are filled with silicon oxide shapes 10b. The result of these procedures is schematically shown in FIG. 6.

Figure 7:
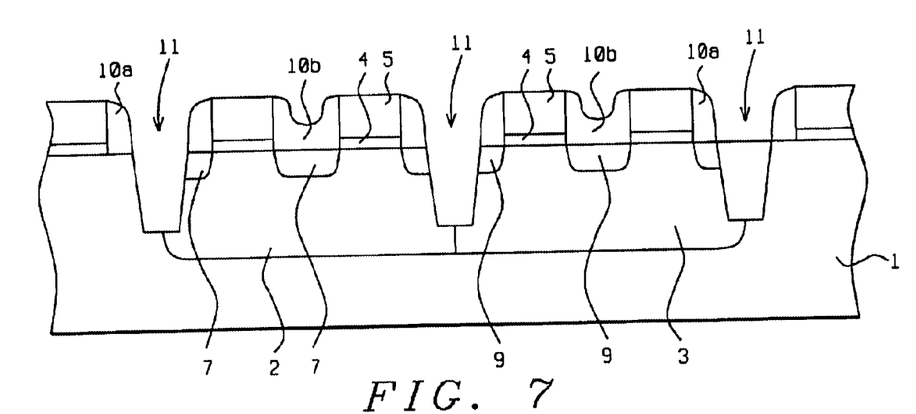

The definition of shallow trench shapes 11, is next addressed and schematically shown using FIG. 7. A selective RIE procedure is employed to remove regions of semiconductor substrate 1, exposed in the wide spaces between dummy gate mask shapes, which are lined with silicon oxide spacers 10a. The selective RIE procedure is accomplished using $SF_6$ as the etchant for silicon, with a high etch rate ratio of silicon to either silicon nitride or silicon oxide, allowing shallow trench shapes 11, to be defined using silicon nitride of dummy gate mask shapes, and silicon oxide spacers 10a, as an etch mask. Silicon oxide shapes 10b, located in the narrow spaces between dummy gate mask shapes, protected underlying well regions from this dry etch procedure. Shallow trench shapes 11, formed to a depth between about 1500 to 7000 Angstroms in semiconductor substrate 1, are located at the interface between P well region 2, and N well region 3, as well as at the interface between the well regions and the non-well regions of semiconductor substrate 1. Shallow trench shapes 11, are defined with a taper between about 75 to 90°, to optimize the filling of these shapes via subsequent CVD procedures.

Figure 8:
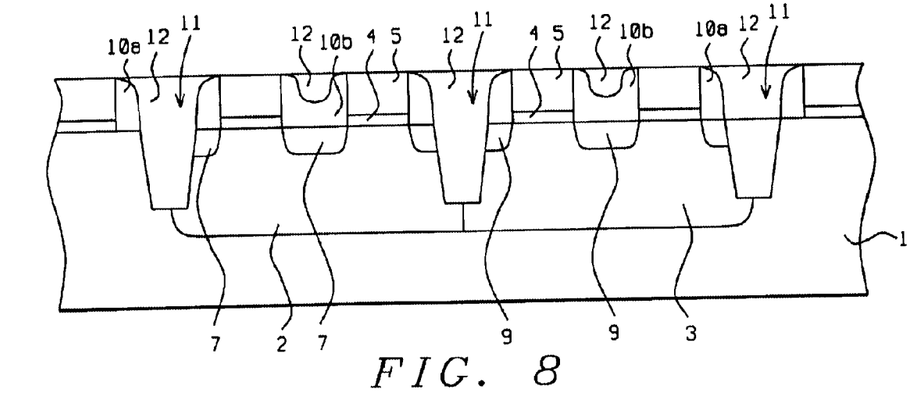

Prior to the insulator filling of shallow trench shapes 11, a thin liner silicon dioxide layer is thermally grown on the exposed surfaces of the shallow trench shapes. The liner layer, not shown in the drawings, formed at a thickness between about 30 to 500 Angstroms, offers improved dielectric integrity when compared to a subsequent CVD silicon oxide layer used to completely fill the shallow trench shapes. Silicon oxide layer 12, is now deposited at a thickness between about 30 to 1000 Angstroms, via LPCVD or PECVD procedures using TEOS as a source, completely filling shallow trench shapes 11. Portions of silicon oxide layer 12, are also deposited overlying the top surface of silicon nitride layer 5, of dummy gate mask shapes, as well as overlying silicon oxide shapes 10b. A chemical mechanical polishing (CMP), procedures is next employed for planarization procedures, selectively removing portions of silicon oxide layer 12, from the top surface of silicon nitride layer 5, resulting in insulator, or silicon oxide filled shallow trench shapes. This is schematically shown in FIG. 8.

Figure 9:
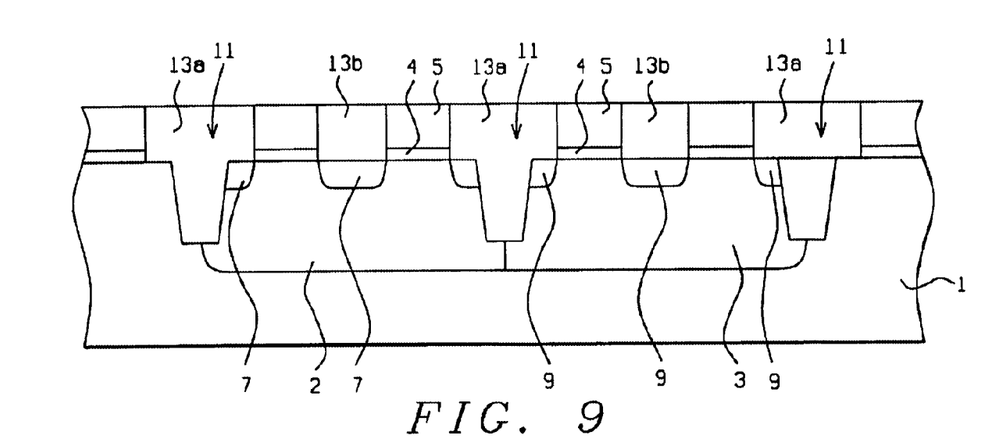

An anneal procedure is next performed at a temperature between about 500 to 1200° C., in an inert ambient, for purposes of densifying the chemically vapor deposited silicon oxide layer 12. The densification procedure results in the evolution STI regions 13a, now comprised of silicon oxide layer 12, in shallow trench shapes 11, and comprised of silicon oxide spacers 10a, previously located on the sides of dummy gate mask shapes. In addition STI regions 13b, are defined in the narrow spaces located between dummy gate mask shapes, with STI regions 13b, comprised with a bottom portion featuring silicon oxide shape 10b, and comprised with a top portion featuring silicon oxide layer 12. The result of the anneal procedure is schematically shown in FIG. 9.

Figure 10:
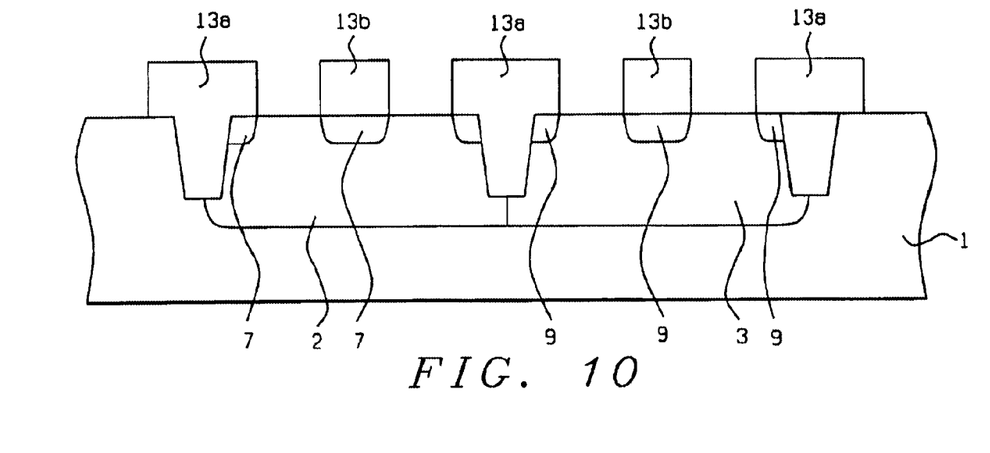

Removal of the dummy gate mask shapes is next addressed and schematically illustrated using FIG. 10. Silicon nitride layer 5, is selectively removed via use of a hot phosphoric acid solution, exposing the top surface of pad silicon dioxide layer 4, located between the STI regions. If desired silicon nitride layer 5, can be removed via a RIE procedure using $Cl_2$ as a selective etchant for silicon nitride. Pad silicon dioxide layer 4, is next selectively removed via a RIE procedure using $CHF_3$ as an etchant. This procedure also results in some removal of silicon oxide from the top of the STI regions. All portions of the heavily doped source/drain regions, in both well regions, are entirely located underlying STI regions 13a, and STI regions 13b.

Figure 11:
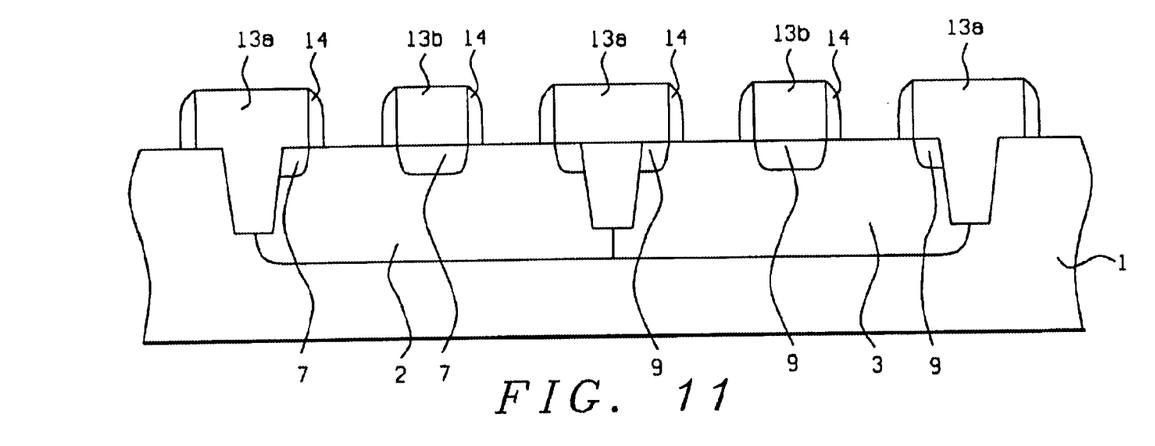

A silicon nitride layer is next deposited at a thickness between about 30 to 1000 Angstroms, via LPCVD or PECVD procedures. The thickness of the silicon nitride layer will subsequently determine the width of lightly doped source/drain (LDD), regions. An anisotopic RIE procedure, using $CF_4$ or $Cl_2$ as a selective etchant for silicon nitride, is then used to define silicon nitride spacers 14, on the sides of STI regions 13a, and on the sides of STI regions 13b. The result of these procedures is schematically shown in FIG. 11.

Figure 12:
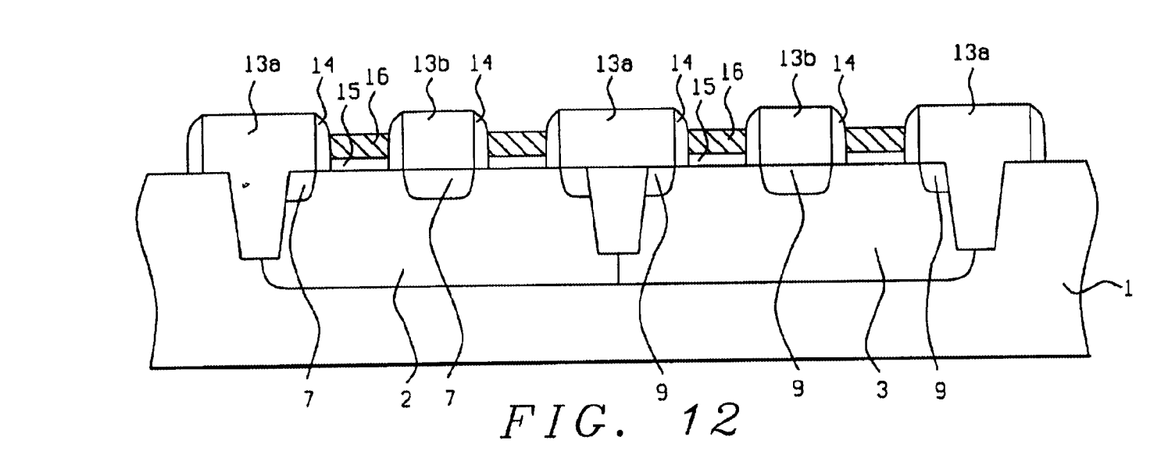

A high dielectric constant (high k), metal oxide layer, such as aluminum oxide ($Al_2O_3$), zirconium oxide ($ZrO_2$), or hafnium oxide ($HfO_2$), is next deposited at a thickness between about 15 to 300 Angstroms, via metal organic chemical vapor deposition (MOCVD), or via atomic layer chemical vapor deposition (ALCVD) procedures. High k layer 15, will be used as the gate insulator layer for the CMOS device. The high dielectric constant of high k metal oxide layer 15, between about 7 to 500, allows the use of a thicker layer. The higher dielectric constant layer allows an equivalent oxide thickness (EOT), equal to the thinner, lower k dielectric counterparts, to be realized. This is followed by deposition of conductive layer comprised of a metal such as tungsten, aluminum, aluminum—copper, copper, or tungsten silicide, at a thickness between about 50 to 1000 Angstroms, via plasma vapor deposition (PVD), or via CVD procedures. If desired the conductive layer can be comprised of an in situ doped polysilicon layer. The thickness of the conductive layer in the spaces between STI regions is greater than the thickness of the conductive layer on the top surface of the STI regions, thus a blanket etch back or chemical mechanical polishing (CMP), procedure can be used to form the desired conductive gate structure, self-aligned to STI regions without the use of photolithographic procedures. The etch back procedures used to remove thinner portions of conductive layer and of thinner high k layer from the top surface of all STI regions is accomplished using anisotropic RIE procedures, using $Cl_2$ as an etchant. This is schematically shown in FIG. 12. If desired a CMP procedure can also be used to remove the thinner portions of the conductive layer from the top surface of the STI regions, again resulting in definition of conductive gate structures, self-aligned to STI structures, with the definition of the conductive gate structures again accomplished without the use of photolithographic procedures.

Figure 13:
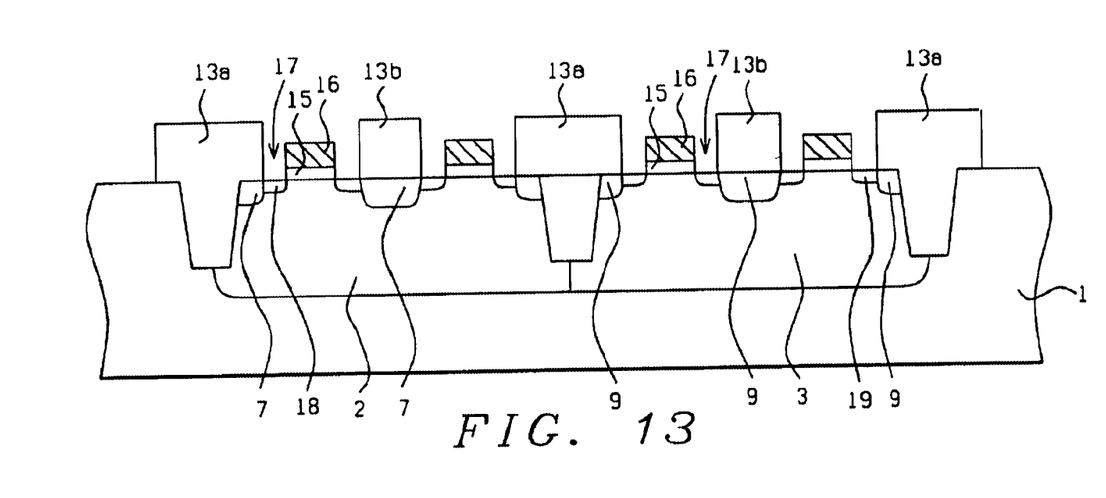

Silicon nitride spacers 14, are now selectively removed from the sides of STI regions 13a, and from the sides of STI regions 13b, via use of a hot phosphoric acid solution. If desired removal of silicon nitride spacers 14, can also be accomplished via a RIE procedure using $Cl_2$ or $CF_4$ as a selective etchant for silicon nitride. Spaces 17, created by the removal of silicon nitride spacers 14, exposing portions of P well region 2, and of N well region 3, will be subjected to ion implantation procedures used to form N type LDD regions 18, in exposed portions of P well region 2, and to form P type LDD regions 19, in N well region 3. Photoresist block out shapes are used to protect each specific well region during implantation procedures performed to the other specific well region. N type LDD regions 18, are obtained via implantation of arsenic or phosphorous ions at an energy between about 1 to 100 KeV, at a dose between about 2E13 to $5E14$ atoms/$cm^2$, while P type LDD regions 19, are obtained via implantation of boron or $BF_2$ ions, at an energy between about 0.1 to 30 KeV, at a dose between about 2E13 to $5E14$ atoms/$cm^2$. The LDD regions are formed self-aligned to conductive gate structures 16, butting heavily doped source/drain counterparts, located underlying the STI regions. The result of these procedures are schematically shown in FIG. 13.

Figure 14:
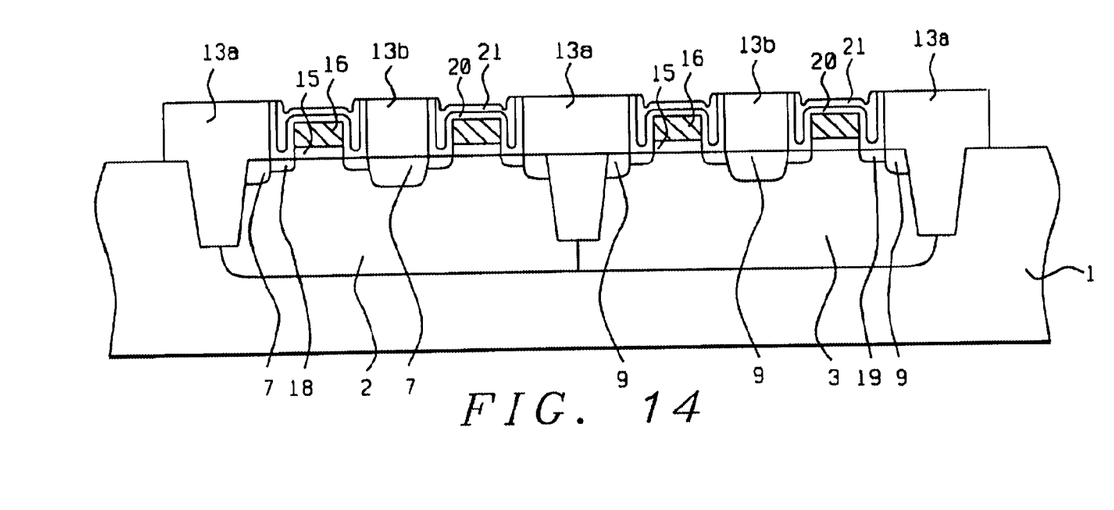

Refilling of spaces 17, created by the removal of silicon nitride spacers 14, is next addressed and schematically shown in FIG. 14. Silicon oxide layer 20, is first deposited to a thickness between about 30 to 1000 Angstroms, via LPCVD or PECVD procedures. Silicon oxide layer 20, lines the sides of conductive gate structures 16, as well as the sides of STI regions 13a and 13b, however without completely filling spaces 17. Next silicon nitride layer 21, is deposited at a thickness between about 50 to 1000 Angstroms, via LPCVD or PECVD procedures, with the composite of silicon nitride layer 21, and silicon oxide layer 20, now completely filling spaces 19. A photoresist shape, not shown in the drawings, is then used as an etch mask to allow the portions of silicon nitride layer 21, to be removed from the top surfaces of STI regions 13a, and 13b, leaving the composite insulator layer, comprised of silicon nitride layer 21, and silicon oxide layer 20, only overlying conductive gate structures 16, as well as only filling spaces 19. The etch procedure used to accomplish this is a RIE procedure, employing $CF_4$ or $Cl_2$ as a selective etchant for silicon nitride. The photoresist shape used protect specific regions during the silicon nitride removal procedure, is then removed via plasma oxygen ashing procedures. If desired a CMP procedure can be used to remove the portions of silicon nitride layer 21, from the top surface of the STI regions, while other portions of silicon nitride layer 21, located on the shorter conductive gate structures, are left remaining.

Figure 15:
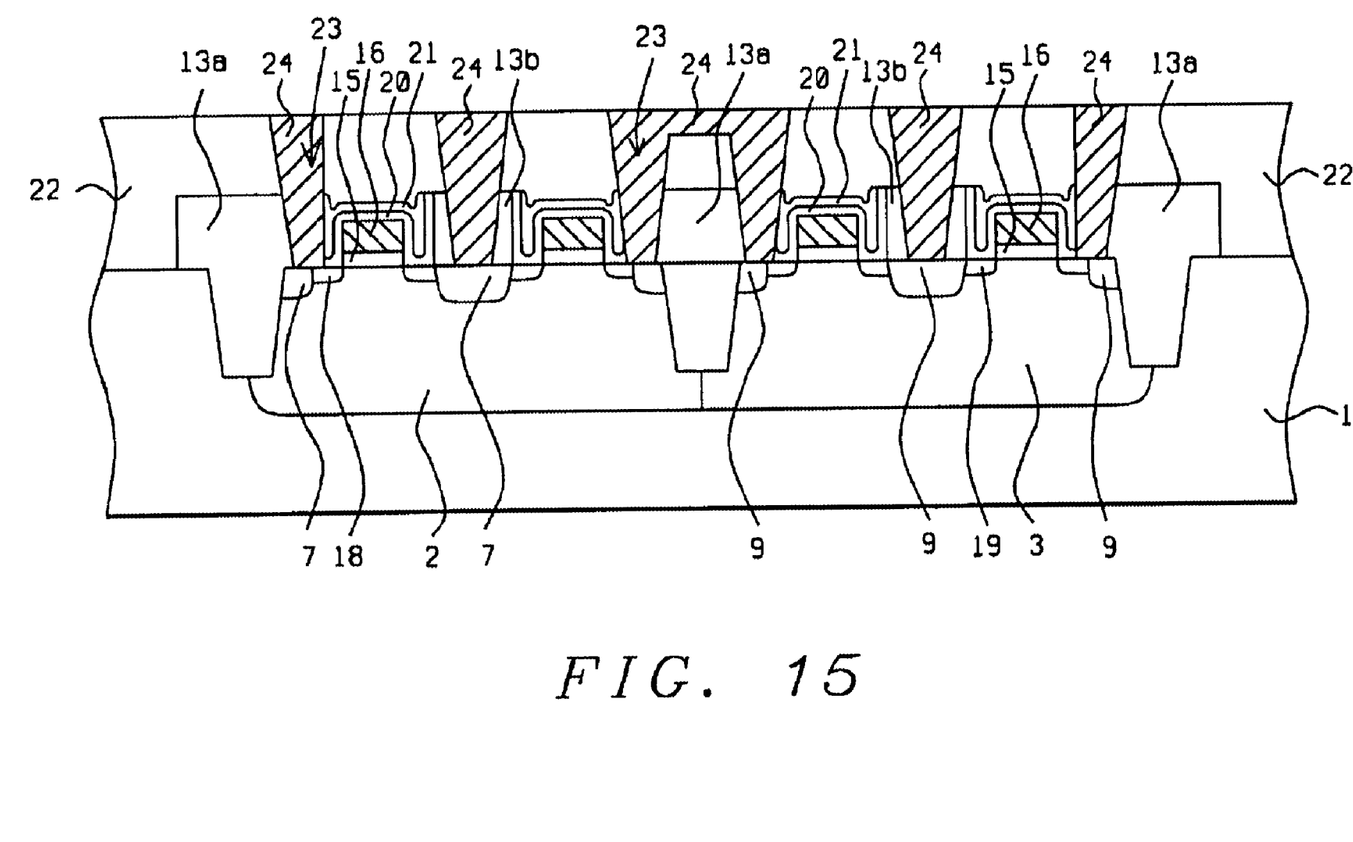

Interlevel dielectric (ILD), layer 22, comprised of silicon oxide or boro-phosphosilicate glass (BPSG), is next deposited to a thickness between about 500 to 1000 Angstroms via LPCVD or PECVD procedures. A CMP procedure is used for planarization purposes, resulting in a smooth top surface topography for ILD layer 22. A photoresist shape, not shown in the drawings, is used as an etch mask to allow openings 23, to be defined in ILD layer 22, as well as in portions of STI regions 13a, and 13b, exposing portions of the top surfaces of the heavily doped source/drain regions in both P well region 2, and N well region 3. Openings 23, are formed via a RIE procedure using $CHF_3$ as a selective etchant for silicon oxide or BPSG, therefore openings 23, butt silicon nitride component 21, of the composite insulator fill located in spaces 17. The presence of silicon nitride component 21, offers protection to the conductive gate structure and to the underlying high k gate insulator layer, during definition of openings 23, as well as during subsequent metal silicide formation procedures. The result of the above procedures is schematically shown in FIG. 15.

After removal of the photoresist shape used for definition of openings 23, via plasma oxygen ashing procedures, a metal layer such as cobalt, nickel, titanium, or tantalum, is deposited via PVD procedures, to a thickness between about 30 to 1000 Angstroms. An anneal procedure is performed using either conventional furnace procedures, or via use of rapid thermal anneal (RTA), procedures, resulting in formation of metal silicide on portions of the heavily doped source/drain regions exposed in openings 23. The metal silicide layers are not shown in the drawings. Portions of the metal layer located on the top surface of ILD layer 22, or on the inside walls of openings 22, remain unreacted and are selectively removed via wet etch procedures. A metal layer such as tungsten, is next deposited via PVD or CVD procedures, at a thickness between about 500 to 5000 Angstroms, completely filling openings 22. Portions of the metal layer are then removed from the top surface of ILD layer 22, via a CMP procedure, resulting in formation of metal contact and interconnect structures 24, in openings 23, overlying and contacting N type heavily doped source/drain regions 7, located in P well region 2, of the NMOS device, and overlying and contacting P type heavily doped source/drain regions 9, located in N well region 3, of the PMOS device.

While this invention has been particularly shown and described with reference to the preferred embodiments thereof, it will be understood by those skilled in the art that various changes in form and details may be made without departing from the spirit or scope of the invention.

What is claimed is:

1. A method of fabricating a metal oxide semiconductor field effect transistor (MOSFET), device on a semiconductor substrate, comprising the steps of:

forming composite insulator structures on top surfaces of first portions of said semiconductor substrate;

forming heavily doped source/drain regions in second portions of said semiconductor substrate, not covered by said composite insulator structures;

forming first insulator spacers on sides of said composite insulator structures, with each first insulator spacer overlying and covering a portion of a heavily doped source/drain region;

defining shallow trench openings in portions of said semiconductor substrate not covered by said composite insulator structures or by said first insulator spacers;

filling said shallow trench openings, and spaces between said composite insulator structures with a first insulator layer, resulting in shallow trench isolation (STI) regions with each STI region comprised of an underlying insulator filled shallow trench opening, and comprised of an overlying first insulator shape located between composite insulator structures, with said first insulator spacers located on sides of said composite insulator structures, now a component of said overlying first insulator shape;

selectively removing said composite insulator structures;

formning second insulator spacers on sides of said STI regions;

forming a gate insulator layer on a portion of said semiconductor substrate not covered by said STI regions or by said second insulator spacers;

forming a conductive gate structure on said gate insulator layer with said conductive gate structure self-aligned to said STI regions;

removing said second insulator spacers;

forming lightly doped source/drain regions in portions of said semiconductor substrate exposed by removal of said second insulator spacers, with each lightly doped source/drain region located adjacent to, and butting to a heavily doped source/drain region, which in turn is located underlying an STI region;

forming a composite insulator layer in space between said STI region and said conductive gate structure, with said composite insulator layer overlying said lightly doped source drain region;

depositing a second insulator layer;

forming openings in said second insulator layer and in said STI regions to expose portions of said heavily doped source/drain regions;

forming metal silicide layers on exposed portions of said heavily doped source/drain region; and forming metal structures in said openings, with said metal structures located overlying said metal silicide layers.

2. The method of claim 1, wherein said composite insulator structures are comprised of an overlying silicon nitride shape at a thickness between about 50 to 2000 Angstroms, and comprised of an underlying silicon dioxide shape at a thickness between about 30 to 1000 Angstroms.

3. The method of claim 1, wherein said heavily doped source/drain regions are N type heavily doped source/drain regions, obtained via implantation of arsenic or phosphorous ions implanted at an energy between about 1 to 100 KeV, at a dose between about 1E15 to 5E15 atoms/cm$^2$.

4. The method of claim 1, wherein said heavily doped source/drain regions are P type heavily doped source/drain regions, obtained via implantation of boron or $BF_2$ ions implanted at an energy between about 0.1 to 30 KeV, at a dose between about 1E15 to 5E15 atoms/cm$^2$.

5. The method of claim 1, wherein said first insulator spacers are silicon oxide spacers, obtained from deposition of a silicon oxide layer obtained via LPCVD or PECVD procedures at a thickness between about 50 to 1000 Angstroms, then defined via anisotropic RIE procedures using $CHF_3$ as an etchant.

6. The method of claim 1, wherein said shallow trench openings are formed to a depth between about 1500 to 7000 Angstroms, with a taper between about 75 to 90°, in said semiconductor substrate, via a RIE procedure using $SF_6$ as a selective etchant for silicon.

7. The method of claim 1, wherein said first insulator layer, used to fill said shallow trench openings, is a silicon oxide layer, obtained via LPCVD or PECVD procedures, at a thickness between about 30 to 500 Angstroms, using tetraethylorthosilicate (TEOS) as a source.

8. The method of claim 1, wherein said composite insulator spacers are removed via RIE procedures, using $CF_4$ or $Cl_2$ as an etchant for silicon nitride, while using $CHF_3$ as an etchant for silicon dioxide.

9. The method of claim 1, wherein said silicon nitride shapes of said composite insulator spacers are selectively removed via wet etch procedures using a hot phosphoric acid solution.

10. The method of claim 1, wherein said second insulator spacers are silicon nitride spacers, obtained from deposition of a silicon nitride layer at a thickness between about 30 to 1000 Angstroms, via LPCVD or PECVD procedures, then defined via anisotropic RIE procedures using $CF_4$ or $Cl_2$ as an etchant.

11. The method of claim 1, wherein said gate insulator layer is a high k dielectric layer, comprised of either aluminum oxide ($Al_2O_3$), zirconium oxide ($ZrO_2$), or hafnium oxide ($HfO_2$), obtained at a thickness between about 15 to 300 Angstroms, via metal organic chemical vapor deposition (MOCVD), or via atomic layer chemical vapor deposition (ALCVD) procedures.

12. The method of claim 1, wherein said gate insulator layer is comprised with a dielectric constant between about 7 to 100.

13. The method of claim 1, wherein said conductive gate structure is formed at a thickness between about 50 to 1000 Angstroms, and is comprised of a material chosen from a group that includes, aluminum, aluminum-copper, copper, tungsten, tungsten silicide, or doped polysilicon.

14. The method of claim 1, wherein said second insulator spacers are selectively removed via wet etch procedures, using hot phosphoric acid as an etchant for silicon nitride.

15. The method of claim 1, wherein said lightly doped source/drain regions are N type heavily doped source/drain regions, obtained via implantation of arsenic or phosphorous ions implanted at an energy between about 1 to 100 KeV, at a dose between about 2E13 to 5E14 atoms/cm$^2$.

16. The method of claim 1, wherein said lightly doped source/drain regions are P type heavily doped source/drain regions, obtained via implantation of boron or $BF_2$ ions implanted at a dose between about 2E13 to 5E14 atoms/cm$^2$.

17. The method of claim 1, wherein said composite insulator layer, located in said space between said STI region and said conductive gate structure, is comprised of an underlying silicon oxide layer obtained at a thickness between about 30 to 1000 Angstroms via LPCVD or PECVD procedures, and comprised of an overlying silicon nitride layer obtained at a thickness between about 50 to 1000 Angstroms via LPCVD or PECVD procedures.

18. A method of fabricating a complimentary metal oxide semiconductor (CMOS), device on a semiconductor substrate, wherein a gate structure is defined self-aligned to isolation regions without the use of photolithographic processing, comprising the steps of:

forming a P well region in a first portion of said semiconductor substrate to be used to accommodate an N channel metal oxide semiconductor (NMOS), device of said CMOS device;

forming an N well region in a second portion of said semiconductor substrate to be used to accommodate a P channel metal oxide semiconductor (PMOS), device of said CMOS device;

forming composite insulator structures on a top surface of said semiconductor substrate, each comprised with an overlying silicon nitride shape and with an underlying silicon dioxide shape;

forming N type heavily doped source/drain regions in portions of said P well region not covered by said composite insulator structures;

forming P type heavily doped source/drain regions in portions of said N well region not covered by said composite insulator structures;

forming silicon oxide spacers on sides of said composite insulator structures, with each silicon oxide spacer overlying and covering a portion of a heavily doped source/drain region;

defining shallow trench openings in portions of said semiconductor substrate not covered by said composite insulator structures or by said silicon oxide spacers;

filling said shallow trench openings with a silicon oxide layer resulting in shallow trench isolation (STI) regions, with each STI region comprised of a silicon oxide filled shallow trench opening, and comprised of an overlying silicon oxide shape located between said composite insulator spacers, and with silicon oxide spacers previously located on sides of said composite insulator structures, now located on sides of, and a component of said overlying silicon oxide shape;

selectively removing said composite insulator structures;

forming silicon nitride spacers on sides of said STI regions;

forming a high dielectric constant (high k) gate insulator layer on portions of said semiconductor substrate not covered by said STI regions or by said silicon nitride spacers;

forming a conductive gate structure on each high k gate insulator layer with said conductive gate structure self-aligned to said STI regions;

removing said silicon nitride spacers;

forming N type lightly doped source/drain regions in portions of said P well region exposed by removal of said silicon nitride spacers, with each N type lightly doped source/drain region located adjacent to, and butting to an N type heavily doped source/drain region, which in turn is located underlying an STI region;

forming P type lightly doped source/drain regions in portions of said N well region exposed by removal of said silicon nitride spacers, with each P type lightly doped source/drain region located adjacent to, and butting to a P type heavily doped source/drain region, which in turn is located underlying an STI region;

forming a composite insulator layer comprised of an overlying silicon oxide layer and an underlying silicon nitride layer, in spaces between said STI region and said conductive gate structure, with said composite insulator layer overlying lightly doped source drain regions;

depositing an interlevel dielectric (ILD) layer;

forming openings in said ILD layer and in said STI regions to expose portions of said N type heavily doped source/drain regions, and to expose portions of said P type heavily doped source/drain regions;

forming cobalt silicide layers on exposed portions of heavily doped source/drain region; and forming metal structures in said openings, with said metal structures located overlying and contacting said cobalt silicide layers.

19. The method of claim 18, wherein the thickness of said overlying silicon nitride shape of said composite insulator layer, is between about 50 to 2000 Angstroms.

20. The method of claim 18, wherein said N type heavily doped source/drain regions are obtained via implantation of arsenic or phosphorous implanted at an energy between about 1 to 100 KeV, at a dose between about 1E15 to 5E15 atoms/cm$^2$.

21. The method of claim 18, wherein said P type heavily doped source/drain regions are obtained via implantation of boron or $BF_2$ ions implanted at an energy between about 0.1 to 30 KeV, at a dose between about 1E15 to 5E15 atoms/cm$^2$.

22. The method of claim 18, wherein said silicon oxide spacers are obtained from deposition of a silicon oxide layer via LPCVD or PECVD procedures at a thickness between about 50 to 1000 Angstroms, then defined via anisotropic RIE procedures using $CHF_3$ as an etchant.

23. The method of claim 18, wherein said shallow trench openings are formed to a depth between about 1500 to 7000 Angstroms in said semiconductor substrate, with a taper between about 75 to 90°, via a RIE procedure using $SF_6$ as a selective etchant for silicon.

24. The method of claim 18, wherein said silicon oxide layer used to fill said shallow trench openings, is obtained via LPCVD or PECVD procedures, at a thickness between about 30 to 500 Angstroms, using tetraethylorthosilicate (TEOS) as a source.

25. The method of claim 18, wherein said composite insulator spacers are removed via RIE procedures, using $CF_4$ or $Cl_2$ as an etchant for silicon nitride, while using $CHF_3$ as an etchant for silicon dioxide.

26. The method of claim 18, wherein said silicon nitride shapes of said composite insulator spacers are selectively removed via wet etch procedures using a hot phosphoric acid solution.

27. The method of claim 18, wherein said silicon nitride spacers are obtained from deposition of a silicon nitride layer at a thickness between about 30 to 1000 Angstroms, via LPCVD or PECVD procedures, and via definition using an anisotropic RIE procedure using $CF_4$ or $Cl_2$ as an etchant for silicon nitride.

28. The method of claim 18, wherein said high k gate insulator layer is comprised of either aluminum oxide ($Al_2O_3$), zirconium oxide ($ZrO_2$), or hafnium oxide ($HfO_2$), obtained at a thickness between about 15 to 300 Angstroms, via metal organic chemical vapor deposition (MOCVD), or via atomic layer chemical vapor deposition (ALCVD) procedures.

29. The method of claim 18, wherein said high k gate insulator layer is comprised with a dielectric constant between about 7 to 100.

30. The method of claim 18, wherein said conductive gate structure is formed at a thickness between about 50 to 1000 Angstroms, and is comprised of a material chosen from a group that includes; aluminum, aluminum-copper, copper, tungsten, tungsten silicide, or doped polysilicon.

31. The method of claim 18, wherein said silicon nitride spacers are selectively removed via wet etch procedures, using hot phosphoric acid as an etchant for silicon nitride.

32. The method of claim 18, wherein said N type lightly doped source/drain regions are obtained via implantation of arsenic or phosphorous ions implanted at an energy between about 1 to 100 KeV, at a dose between about 2E13 to 5E14 atoms/cm$^2$.

33. The method of claim 18, wherein said P type lightly doped source/drain regions are obtained via implantation of boron or $BF_2$ ions implanted at a dose between about 2E13 to 5E14 atoms/cm$^2$.

* * * * *